(12) United States Patent
Park et al.

(10) Patent No.: US 9,142,525 B2
(45) Date of Patent: Sep. 22, 2015

(54) SEMICONDUCTOR DEVICE BONDED BY ANISOTROPIC CONDUCTIVE FILM

(71) Applicants: Do Hyun Park, Uiwang-si (KR); Kyu Bong Kim, Uiwang-si (KR); Woo Jun Lim, Uiwang-si (KR)

(72) Inventors: Do Hyun Park, Uiwang-si (KR); Kyu Bong Kim, Uiwang-si (KR); Woo Jun Lim, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 14/084,741

(22) Filed: Nov. 20, 2013

(65) Prior Publication Data

US 2014/0138828 A1 May 22, 2014

(30) Foreign Application Priority Data

Nov. 20, 2012 (KR) .................. 10-2012-0131289

(51) Int. Cl.
*H01L 23/488* (2006.01)
*H01L 23/00* (2006.01)
*C09J 9/02* (2006.01)

(52) U.S. Cl.
CPC . *H01L 24/29* (2013.01); *C09J 9/02* (2013.01); *H01L 24/32* (2013.01); *H01L 24/83* (2013.01); *H01L 2224/293* (2013.01); *H01L 2224/294* (2013.01); *H01L 2224/2929* (2013.01); *H01L 2224/2939* (2013.01); *H01L 2224/29339* (2013.01); *H01L 2224/29344* (2013.01); *H01L 2224/29347* (2013.01); *H01L 2224/29355* (2013.01); *H01L 2224/32225* (2013.01); *H01L 2224/81191* (2013.01); *H01L 2224/81903* (2013.01); *H01L 2224/83851* (2013.01); *H01L 2224/9211* (2013.01); *H01L 2924/07802* (2013.01); *H01L 2924/07811* (2013.01)

(58) Field of Classification Search
USPC .......... 257/433, 737, 738, E23.027, E23.112; 438/149, 458; 524/555
See application file for complete search history.

(56) References Cited

U.S. PATENT DOCUMENTS

| | | | |
|---|---|---|---|
| 2005/0148121 A1* | 7/2005 | Yamazaki et al. ............. | 438/149 |
| 2005/0230773 A1* | 10/2005 | Saito et al. .................... | 257/433 |
| 2005/0288427 A1* | 12/2005 | Jeon et al. ...................... | 524/555 |

FOREIGN PATENT DOCUMENTS

| | | | |
|---|---|---|---|
| KR | 100809834 | * | 3/2008 |
| KR | 100832677 | * | 5/2008 |
| KR | 10-2009-0029537 A | | 3/2009 |

* cited by examiner

*Primary Examiner* — Kimberly Rizkallah
*Assistant Examiner* — Bo Bin Jang
(74) *Attorney, Agent, or Firm* — Lee & Morse, P.C.

(57) ABSTRACT

A semiconductor device including a first connecting member including a first electrode; a second connecting member including a second electrode; and an anisotropic conductive film between the first connecting member and the second connecting member, the anisotropic conductive film bonding the first electrode to the second electrode, wherein the anisotropic conductive film exhibits linear indentations in an inter-terminal space of the second connecting member after pre-compression and primary compression of the anisotropic conductive film onto the first and second connecting members.

12 Claims, 1 Drawing Sheet

SEMICONDUCTOR DEVICE BONDED BY ANISOTROPIC CONDUCTIVE FILM

CROSS-REFERENCE TO RELATED APPLICATION

Korean Patent Application No. 10-2012-0131289, filed on Nov. 20, 2012, in the Korean Intellectual Property Office, and entitled: "SEMICONDUCTOR DEVICE BONDED BY ANISOTROPIC CONDUCTIVE FILM," is incorporated by reference herein in its entirety.

BACKGROUND

1. Field

Embodiments relate to a semiconductor device bonded by an anisotropic conductive film.

2. Description of the Related Art

Anisotropic conductive films (ACFs) may refer to film-shaped adhesives in which conductive particles, e.g., metal particles including nickel or gold particles or metal-coated polymer particles, are dispersed in a resin, e.g., an epoxy resin. Anisotropic conductive films, which may be formed of polymer layers having electric anisotropy and adhesiveness, may exhibit conductive properties in a thickness direction of the films and insulating properties in a surface or lateral direction thereof.

When an anisotropic conductive film is disposed between circuit boards and is subjected to heating and compression under certain conditions, circuit terminals of the circuit boards may be electrically connected through conductive particles, and an insulating adhesive resin may fill spaces between adjacent circuit terminals to isolate the conductive particles from each other, thereby providing high insulation performance between the circuit terminals.

SUMMARY

Embodiments are directed to a semiconductor device bonded by an anisotropic conductive film.

The embodiments may be realized by providing a semiconductor device including a first connecting member including a first electrode; a second connecting member including a second electrode; and an anisotropic conductive film between the first connecting member and the second connecting member, the anisotropic conductive film bonding the first electrode to the second electrode, wherein the anisotropic conductive film exhibits linear indentations in an inter-terminal space of the second connecting member after pre-compression and primary compression of the anisotropic conductive film onto the first and second connecting members.

The linear indentations may be in an area occupying about 30% or less of an overall area of the inter-terminal space while sharing a centerline of the inter-terminal space.

The first connecting member may have a film shape and the second connecting member may have a substrate shape.

The pre-compression may be performed at a temperature of about 50° C. to about 70° C. under a load of about 1.0 MPa to about 5.0 MPa for about 1 to about 5 seconds, and the primary compression may be performed at a temperature of about 110° C. to about 150° C. under a load of about 1.0 MPa to about 4.0 MPa for about 1 to about 7 seconds.

The anisotropic conductive film may have an adhesive strength of about 800 gf/cm or more as measured after the pre-compression and the primary compression.

The anisotropic conductive film may include about 10 wt % to about 70 wt % of an acrylic copolymer resin; about 1 wt % to about 50 wt % of a polyurethane resin; about 1 wt % to about 40 wt % of a radical polymerizable material; and about 1 wt % to about 30 wt % of conductive particles, all wt % being based on a total weight of the anisotropic conductive film in terms of solid content.

The acrylic copolymer resin may include repeating units derived from a hydroxyl group-substituted alkyl (meth)acrylate monomer.

The hydroxyl group-substituted alkyl (meth)acrylate monomer may be hydroxyethyl (meth)acrylate.

The repeating units derived from the hydroxyl group-substituted alkyl (meth)acrylate monomer may be present in an amount of about 10 wt % to about 50 wt %, based on a total weight of the acrylic copolymer resin.

The acrylic copolymer resin may be prepared by copolymerization of a hydroxyl group-substituted alkyl (meth)acrylate monomer and at least one of an aliphatic alkyl(meth) acrylate monomer or an alicyclic alkyl(meth)acrylate monomer.

The acrylic copolymer resin may include repeating units derived from cyclohexyl (meth)acrylate, methyl (meth)acrylate, and hydroxyethyl (meth)acrylate monomers.

The acrylic copolymer resin may have a glass transition temperature of about 70° C. or higher.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
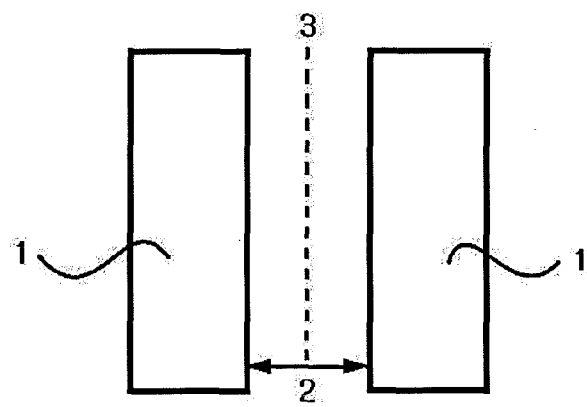
FIG. 1 illustrates a schematic plan view of a space between terminals that acts as a reference in determination as to linearity of indentations.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The embodiments may provide a semiconductor device bonded by an anisotropic conductive film. The anisotropic conductive film may include an acrylic copolymer (including repeating units derived from a hydroxyl group-substituted alkyl (meth)acrylate monomer) as a binder resin, thereby providing excellent adhesion while exhibiting linear indentations.

In accordance with an embodiment, a semiconductor device may include a first connecting member including a first electrode; a second connecting member including a second electrode; and an anisotropic conductive film between the first connecting member and the second connecting member and bonding the first electrode to the second electrode.

For example, the anisotropic conductive film may exhibit linear indentations in a space between terminals of the second connecting member after pre-compression and primary compression of the anisotropic conductive film onto the first and second connecting members.

As used herein, the term "indentation" means a compressed mark formed on a portion of an anisotropic conductive film placed in a space between terminals of an adherend (hereinafter, also referred to as the "inter-terminal space") when the anisotropic conductive film is compressed onto the adherend. Such indentations may act as a standard that directly or indirectly indicates uniform distribution of pressure applied to the anisotropic conductive film upon compression of the anisotropic conductive film. Thus, it is possible to determine whether the anisotropic conductive film is sufficiently bonded to a substrate or the like, and thus, whether a semiconductor device is sufficiently bonded to the film, based on an indentation state.

Referring to FIG. 1, linear indentations will now be described. FIG. 1 illustrates a schematic plan view of an inter-terminal space. Referring to FIG. 1, linear indentations or linearity of indentations means that, in the case where a lower adherend is a circuit board (e.g., a printed circuit board) having a plurality of electrodes 1 thereon, indentations formed in an inter-terminal space 2 of an anisotropic conductive film compressed onto the lower circuit board may have a substantially linear shape when the anisotropic conductive film placed between the circuit board and an upper adherend is subjected to primary compression.

For example, when the area of the indentations formed on the compressed anisotropic conductive film occupies about 30% or less of the overall area of the inter-terminal space while sharing a centerline 3 of the inter-terminal space 2, these indentations may be defined as linear indentations. When the area of the indentations occupies more than 30% of the overall area of the inter-terminal space while sharing the centerline 3 of the inter-terminal space 2, these indentations may be defined as rounded indentations.

When the indentations formed in the inter-terminal space have linearity upon compression of the anisotropic conductive film, it may be determined that pressure is evenly distributed on the anisotropic conductive film upon compression, and the film is sufficiently bonded to a corresponding substrate or device.

In an implementation, the indentations may be measured after pre-compression and primary compression of the anisotropic conductive film between first and second connecting members.

The first connecting member may have a film shape, and the second connecting member may have a substrate shape.

For example, compression may be performed through pre-compression and primary compression of an anisotropic conductive film according to an embodiment onto a PCB (pitch: 200 μm, terminal width: 100 μm, distance between terminals: 100 μm, terminal height: 35 μm).

Pre-compression may be performed at a temperature of about 50° C. to about 70° C. under a load of about 1.0 MPa to about 5.0 MPa for about 1 to about 5 seconds, e.g., under a load of about 1.0 MPa to about 3.0 MPa for about 1 to about 3 seconds. Primary compression may be performed at a temperature of about 110° C. to about 150° C. under a load of about 1.0 MPa to about 4.0 MPa for about 1 to about 7 seconds, e.g., under a load of about 1.5 MPa to about 3.5 MPa for about 1 to about 5 seconds.

Within this range, pressure may be uniformly distributed on the anisotropic conductive film upon compression of the anisotropic conductive film. Accordingly, the film may be sufficiently bonded to the corresponding substrate or device.

An anisotropic conductive film according to an embodiment may have an adhesive strength of about 800 gf/cm or more, e.g., about 900 gf/cm or more or about 1,000 gf/cm or more, as measured after the anisotropic conductive film is subjected to primary compression at a temperature of about 110° C. to about 150° C. under a load of about 1.0 MPa to about 4.0 MPa for about 1 to about 7 seconds.

Within this range, the anisotropic conductive film may help secure a predetermined level or more of adhesive strength, and thus may exhibit good indentation characteristics.

Adhesive strength of the anisotropic conductive film may be measured as follows. For example, a prepared anisotropic conductive film may be placed between a PCB (pitch: 300 μm, terminal width: 150 μm, distance between terminals: 150 μm, terminal height: 35 μm) and a COF (pitch: 300 μm, terminal width: 150 μm, distance between terminals: 150 μm, terminal height: 8 μm), and may be bonded therebetween under the following conditions.

1) Pre-compression: 60° C., 1 second, 1.0 MPa
2) Primary compression: 130° C., 3 seconds, 3.0 MPa Then, the adhesive strength may be measured at a peel angle of 90° and a peel speed of 50 mm/min using a peel strength tester H5KT (Tinius Olsen).

The anisotropic conductive film according to an embodiment may include, e.g., a) an acrylic copolymer resin; b) a polyurethane resin; c) a radical polymerizable material; and d) conductive particles.

Next, the respective components of an anisotropic conductive film according to an embodiment will be described in more detail. Herein, the content of each component is based on the total weight of an anisotropic conductive film composition (in terms of solid content). Further, in preparation of the anisotropic conductive film, each of the components may be dissolved in an organic solvent and deposited onto a release film, followed by drying for a predetermined time for evaporation of the organic solvent. Thus, a solid anisotropic conductive film may also contain the respective components of the anisotropic conductive film composition (in terms of solid content).

a) Acrylic Copolymer Resin

In an embodiment, the acrylic copolymer resin may include repeating units derived from an alkyl (meth)acrylate monomer substituted with a hydroxyl group.

When repeating units derived from the hydroxyl group-substituted alkyl (meth)acrylate monomer are included in the acrylic copolymer resin, the hydroxyl group may help enhance adhesion of the anisotropic conductive film.

For example, acrylic resins may have lower elasticity than urethane resins and may exhibit slightly lower flowability. Thus, when an anisotropic conductive film is prepared using a binder resin containing an acrylic resin, indentations formed on the film may exhibit linearity upon primary compression, thereby providing a good indentation state. However, the prepared anisotropic conductive film may exhibit a deterioration in adhesion, which is a basic property of the film. Therefore, the embodiments are directed to providing a semiconductor device bonded by an anisotropic conductive film, which provides excellently linear indentations while exhibiting high adhesion by preparing the acrylic copolymer resin using the hydroxyl group-substituted alkyl (meth)acrylate monomer.

In an implementation, the acrylic copolymer resin may be prepared through copolymerization of the hydroxyl group-substituted alkyl (meth)acrylate monomer and another functional monomer copolymerizable therewith. Examples of the copolymerizable functional monomer may include an aliphatic alkyl (meth)acrylate monomer or an alicyclic alkyl (meth)acrylate monomer, and modified (meth)acrylates thereof, (meth)acrylic acid, vinyl acetates, or modified acryl monomers thereof, compounds having a functional group capable of reacting therewith, and the like.

In an implementation, the acrylic copolymer resin may be a binary acrylic copolymer resin prepared through copolymerization of the hydroxyl group-substituted alkyl (meth)acrylate monomer and the alicyclic alkyl (meth)acrylate monomer or aliphatic alkyl (meth)acrylate monomer. In an implementation, the acrylic copolymer resin may be a tertiary acrylic copolymer resin (e.g., a terpolymer) prepared through copolymerization of the hydroxyl group-substituted alkyl (meth)acrylate monomer, the alicyclic alkyl (meth)acrylate monomer, and the aliphatic alkyl (meth)acrylate monomer.

Examples of the hydroxyl group-substituted alkyl (meth)acrylate monomer may include 2-hydroxyethyl (meth)acrylate, 4-hydroxybutyl (meth)acrylate, 2-hydroxypropyl(meth)acrylate, 2-hydroxybutyl (meth)acrylate, 6-hydroxyhexyl (meth)acrylate, 1,4-cyclohexanedimethanol mono(meth)acrylate, chloro-2-hydroxypropyl acrylate, and diethylene glycol mono(meth)acrylate. These may be used alone or in combination thereof.

Examples of the alicyclic alkyl (meth)acrylate monomer may include isobornyl(meth)acrylate, bornyl (meth)acrylate, and cyclohexyl (meth)acrylate. These may be used alone or in combination thereof.

Examples of the aliphatic alkyl (meth)acrylate monomer may include methyl (meth)acrylate, ethyl (meth)acrylate, propyl (meth)acrylate, butyl (meth)acrylate, pentyl (meth)acrylate, hexyl(meth)acrylate, heptyl (meth)acrylate, octyl (meth)acrylate, nonyl (meth)acrylate, decyl (meth)acrylate, and dodecyl (meth)acrylate. These may be used alone or in combination thereof.

In an implementation, the acrylic copolymer may be a tertiary acrylic copolymer resin prepared through copolymerization of 2-hydroxyethyl (meth)acrylate, cyclohexyl (meth)acrylate and methyl (meth)acrylate.

In an implementation, repeating units derived from the hydroxyl group-substituted alkyl (meth)acrylate monomer may be present in an amount of about 10 wt % to about 50 wt %, e.g., about 15 wt % to about 45 wt % or about 20 to about 40 wt %, based on a total weight of the acrylic copolymer. Within this range, the hydroxyl group may be suitably or sufficiently provided to the acrylic copolymer resin, thereby enhancing adhesion of the acrylic copolymer resin having relatively low flowability.

In an implementation, the acrylic copolymer resin may have a glass transition temperature (Tg) of about 70° C. or higher, e.g., from about 80° C. to about 150° C. When using an acrylic copolymer resin having a glass transition temperature within this range, the anisotropic conductive film may exhibit linear indentations, thereby providing high bonding reliability.

The acrylic copolymer resin may have a weight average molecular weight of about 5,000 g/mol to about 500,000 g/mol, e.g., about 10,000 g/mol to about 400,000 g/mol or about 30,000 g/mol to about 300,000 g/mol.

When using an acrylic copolymer resin having a weight average molecular weight within this range, it is possible to prevent deterioration in film formability, which may otherwise occur in the case of using an acrylic copolymer resin having a very low weight average molecular weight, and to prevent deterioration in compatibility, which may otherwise occur in the case of using an acrylic copolymer resin having a very high weight average molecular weight. Furthermore, it is possible to fabricate a semiconductor device bonded by an anisotropic conductive film, which exhibits excellent adhesion and reliability.

In an implementation, the acrylic copolymer resin may be present in an amount of about 10 wt % to about 70 wt %, e.g., about 10 wt % to about 60 wt % or about 20 wt % to about 50 wt %, based on a total weight of the anisotropic conductive film in terms of solid content.

Including the acrylic copolymer resin within this amount may help ensure that it is possible to prevent deterioration in reworkability due to softening of the film after pre-compression, and to prevent deterioration in adhesion and film detachment upon pre-compression due to excessive increase in film strength.

b) Polyurethane Resin

As used in this embodiment, the polyurethane resin may include a urethane bond and may be prepared through polymerization of, e.g., isophorone diisocyanate, polytetramethylene glycol, or the like. The polyurethane resin may have a weight average molecular weight of about 10,000 g/mol to about 50,000 g/mol.

In an implementation, the polyurethane resin may be a polyurethane acrylate resin. The polyurethane acrylate resin may include diisocyanates, polyols, diols, and/or (meth)acrylates.

Diisocyanate

In an implementation, a suitable diisocyanate may be used. Examples of diisocyanates may include aromatic, aliphatic or alicyclic diisocyanates, and mixtures thereof. For example, the diisocyanates may include tetramethylene-1,4-diisocyanate, hexamethylene-1,6-diisocyanate, cyclohexylene-1,4-diisocyanate, methylenebis(4-cyclohexyldiisocyanate), isophorone diisocyanate, and 4,4-methylenebis(cyclohexyldiisocyanate). These may be used alone or in combination thereof.

Polyol

In an implementation, a suitable polyol may be used. Examples of polyols may include polyester polyol, polyether polyol, polycarbonate polyol, and the like.

The polyester polyol may be obtained through condensation of a dicarboxylic acid compound and a diol compound.

For example, a suitable dicarboxylic acid compound may be used. Examples of the dicarboxylic acid compound may include succinic acid, glutaric acid, isophthalic acid, adipic acid, suberic acid, azelaic acid, sebacic acid, dodecanedicarboxylic acid, hexahydrophthalic acid, isophthalic acid, terephthalic acid, ortho-phthalic acid, tetrachlorophthalic acid, 1,5-naphthalenedicarboxylic acid, fumaric acid, maleic acid, itaconic acid, citraconic acid, mesaconic acid, and tetrahydrophthalic acid. These may be used alone or in combination thereof.

In addition, a suitable diol compound may be used. Examples of the diol compound may include ethylene glycol, propylene glycol, 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, and 1,4-cyclohexanedimethanol. These may be used alone or in combination thereof.

Examples of the polyether polyol may include polyethylene glycol, polypropylene glycol, and polytetraethylene glycol. These may be used alone or in combination thereof.

Examples of the polycarbonate polyol may include polyalkylene carbonate and silicone-derived polycarbonate polyols. These may be used alone or in combination thereof.

Diol

A suitable diol may be used. Examples of diols may include 1,3-propanedoil, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4- trimethyl-1,3-pentanediol, and 1,4-cyclohexanedimethanol. These may be used alone or in combination thereof (Meth)acrylate The (meth)acrylate may include, e.g., hydroxy (meth)acrylate or amine (meth)acrylate.

In an implementation, the polyurethane resin may be present in an amount of about 1 wt % to about 50 wt %, e.g.; about 1 wt % to about 45 wt %, or about 10 wt % to about 40 wt %, based on the total weight of the anisotropic conductive film in terms of solid content.

Including the polyurethane resin within this amount may help ensure that it is possible to prevent bonding failure and deterioration in long-term bonding reliability due to low flowability of the film composition, and to prevent deterioration in film strength and in heat resistance.

c) Radical Polymerizable Material

In an implementation, a suitable radical polymerizable material may be used.

Examples of the radical polymerizable material may include methyl (meth)acrylate, ethyl(meth)acrylate, n-butyl (meth)acrylate, isobutyl (meth)acrylate, t-butyl (meth)acrylate, 2-ethylhexyl (meth)acrylate, isodecyl (meth)acrylate, n-lauryl (meth)acrylate, $C_{12}$-$C_{15}$ alkyl(meth)acrylates, n-stearyl (meth)acrylate, n-butoxyethyl (meth)acrylate, butoxy diethylene glycol (meth)acrylate, methoxy triethylene glycol (meth)acrylate, methoxy polyethylene glycol (meth)acrylate, cyclohexyl (meth)acrylate, tetrahydrofurfuryl(meth)acrylate, benzyl(meth)acrylate, 2-phenoxyethyl (meth)acrylate, isobornyl (meth)acrylate, 2-hydroxyethyl (meth)acrylate, 2-hydroxypropyl (meth)acrylate, 2-hydroxybutyl (meth)acrylate, 4-hydroxybutyl (meth)acrylate, dimethylaminoethyl (meth)acrylate, diethylaminoethyl(meth) acrylate, (meth)acrylic acid, 2-(meth)acryloyloxy ethylsuccinic acid, 2-(meth)acryloyloxyethyl hexahydrophthalate, 2-(meth)acryloyloxyethyl-2-hydroxypropylphthalate, glycidyl (meth)acrylate, 2-(meth)acryloyloxyethyl acid phosphate, ethylene glycol di(meth)acrylate, diethylene glycol di(meth)acrylate, triethylene glycol di(meth)acrylate, 1,4-butanediol di(meth)acrylate, neopentyl glycol di(meth) acrylate, 1,6-hexanediol di(meth)acrylate, 1,9-nonanediol di(meth)acrylate, 1,10-decanediol di(meth)acrylate, glycerin di(meth)acrylate, 2-hydroxy-3-acryloyloxypropyl (meth) acrylate, dimethylol tricyclodecane di(meth)acrylate, trifluoroethyl (meth)acrylate, perfluorooctylethyl (meth)acrylate, isoamyl acrylate, lauryl acrylate, di(meth)acrylates of ethylene oxide adducts of bisphenol A, di(meth)acrylates of propyleneoxide adducts of bisphenol A, trimethylolpropanebenzoate-(meth)acrylate, bisphenol A diglycidyl di(meth) acrylate, adducts of toluene diisocyanate and 2-hydroxy-3-phenoxypropyl (meth)acrylate, trimethylol propane tri(meth) acrylate, tri(meth)acrylate of ethylene oxide modified trimethylol propane, pentaerythritol tri(meth)acrylate, pentaerythritol tetra(meth)acrylate, dipentaerythritol hexa(meth) acrylate, adducts of pentaerythritol tri(meth)acrylate and hexamethylene diisocyanate, adducts of pentaerythritol tri (meth)acrylate and toluene diisocyanate, adducts of pentaerythritol tri(meth)acrylate and isophorone diisocyanate, and adducts of dipentaerythritol penta(meth)acrylate and hexamethylene diisocyanate. These may be used alone or in combination thereof.

The radical polymerization material may be present in an amount of about 1 wt % to about 40 wt %, e.g., about 1 wt % to about 35 wt % or about 10 wt % to about 30 wt %, based on the total weight of the anisotropic conductive film in terms of solid content. Within this content range, the radical polymerization material may permit the entirety of a cured product to form a sufficient acrylate curing structure and may help prevent an excessive increase in hardness of the cured product and deterioration in peel strength between interfaces and adhesive strength.

d) Conductive Particles

In an implementation, suitable conductive particles may be used.

Examples of the conductive particles may include metal particles such as gold (Au), silver (Ag), nickel (Ni), copper (Cu), and solder particles; carbon particles; resin particles, such as polyethylene, polypropylene, polyester, polystyrene, polyvinyl alcohol and modified resin particles thereof plated and coated with metals, such as gold (Au), silver (Ag), nickel (Ni), and solder; and insulated conductive particles obtained by further coating insulating particles on the metal-coated polymer resin particles. These may be used alone or in combination thereof.

The conductive particles may have various average particle diameters depending on pitches of circuits. In an implementation, the average particle diameter of the conductive particles may be about 1 μm to about 30 μm, as desired.

The conductive particles may be present in an amount of about 1 wt % to about 30 wt %, e.g., about 1 wt % to about 20 wt % or about 1 wt % to about 15 wt %, based on the total weight of the anisotropic conductive film in terms of solid content. Within this content range, the anisotropic conductive film may exhibit excellent bonding characteristics by helping to prevent failure in bonding and/or isolation.

In an implementation, the anisotropic conductive film may further include a thermoplastic resin as a binder and a curing initiator.

Thermoplastic Resin

In an implementation, a suitable thermoplastic resin may be used.

Examples of the thermoplastic resin may include olefin resins, butadiene resins, acrylonitrile butadiene rubber (NBR), carboxylic group-terminated butadiene rubber, phenoxy resins, and ethylene-vinyl acetate (EVA). These may be used alone or in combination thereof.

The thermoplastic resin may provide high compressive adhesion, and the anisotropic conductive film may exhibit excellent adhesion and cohesion upon a process of connecting circuits through heating and pressing, thereby enabling good connection between circuit terminals.

In an implementation, the thermoplastic resin may be present in an amount of about 1 wt % to about 40 wt %, e.g., about 1 wt % to about 30 wt % or about 1 wt % to about 20 wt %, based on the total weight of the anisotropic conductive film in terms of solid content.

Within this content range of the thermoplastic resin, it is possible to help prevent formation of an uneven surface of the anisotropic conductive film due to fine phase separation, which may otherwise occur in the case of using a very small amount of the thermoplastic resin, and to help prevent deterioration in long term connection reliability due to excessive shrinkage or expansion within a semiconductor bonding structure of the anisotropic conductive film, which may otherwise occur in the case of using a very large amount of the thermoplastic resin.

Curing Initiator

In an implementation, a suitable curing initiator may be used. Examples of the curing initiator may include peroxide-based (organic peroxides) and azo-based initiators.

Examples of the peroxide-based initiator may include acetylacetone peroxide, methylcyclohexanone peroxide, methylethylketone peroxide, 1,1-bis(t-butylperoxy)cyclohexane, 1,1-bis(t-butylperoxy)-2-methylcyclohexane, 1,1-bis(t-butylperoxy)-3,3,5-trimethylcyclohexane, n-butyl-4,4- bis(t-butylperoxy)valerate, 2,2-bis(t-butylperoxy)butane, t-butylhydroperoxide, p-menthane hydroperoxide, 1,1,3,3-tetramethylbutylhydroperoxide, α',α'-bis(t-butylperoxy)diisopropylbenzene, 2,5-dimethyl-2,5-bis(t-butylperoxy)hexane, 2,5-dimethyl-2,5-bis(t-butylperoxy)hexane-3, benzoyl peroxide, lauryl peroxide, stearoyl peroxide, succinic acid peroxide, 3,5,5-trimethylhexanoyl peroxide, di-2-ethoxyethyl peroxy dicarbonate, diisopropyl peroxy carbonate, di-3-methoxybutyl peroxy dicarbonate, di-2-ethylhexyl peroxy dicarbonate, bis(4-t-butylcyclohexyl)peroxy dicarbonate, t-butyl peroxyacetate, t-butyl peroxy-2-ethylhexyl monocarbonate, t-butyl peroxyisopropyl monocarbonate, t-butyl peroxylaurate, t-butyl peroxy maleic acid, t-butyl peroxy neodecanoate, t-butyl peroxy-2-ethylhexanoate, t-butyl peroxy pivalate, t-butyl peroxy benzoate, t-butyl peroxy-m-toluate/benzoate, t-butyl peroxy-3,3,5-trimethylhexanoate, α',α'-bis(neodecanoylperoxy)diisopropylbenzene, cumyl peroxy neodecanoate, 1-cyclohexyl-1-methylethyl peroxy neodecanoate, 2,5-dimethyl-2,5-bis(m-toluoylperoxy)hexane, 2,5-dimethyl-2,5-bis(2-ethylhexanoylperoxy)hexane, 2,5-dimethyl-2,5-bis(benzoylperoxy)hexane, t-hexyl peroxy isopropyl monocarbonate, t-hexyl peroxy neodecanoate, t-hexyl peroxy-2-ethylhexanoate, t-hexyl peroxy pivalate, 1,1,3,3-tetramethylbutyl peroxy-2-ethylhexanoate, and 3,3',4,4'-tetra(t-butyl peroxy carbonyl)benzophenone. These may be used alone or in combination thereof.

Examples of the azo-based initiator may include 2,2'-azobis(4-methoxy-2,4-dimethyl valeronitrile), dimethyl 2,2'-azobis(2-methyl propionate), and 2,2'-azobis(N-cyclohexyl-2-methyl propionamide). These may be used alone or in combination thereof.

The curing initiator may be present in an amount of about 0.01 wt % to about 20 wt %, e.g., about 0.01 wt % to about 15 wt % or about 0.1 wt % to about 10 wt %, based on the total weight of the anisotropic conductive film in terms of solid content. Within this amount, the film composition may be sufficiently cured in a short time and has good compatibility, thereby allowing efficient formation of the anisotropic conductive film. Accordingly, the embodiments may provide a semiconductor device bonded by a rapid curable anisotropic conductive film, which may be rapidly cured at low temperature.

In an implementation, the anisotropic conductive film may further include an additive. The additive may include, e.g., polymerization inhibitors, anti-oxidants, heat stabilizers, curing accelerators, coupling agents, or the like, in order to provide additional properties to the film without deteriorating fundamental properties of the film. The amounts of these additives may be determined in various ways according to the purpose and desired effects of the film.

The anisotropic conductive film according to the embodiments may be prepared by a suitable method.

No special apparatus or equipment is required to form the anisotropic conductive film. For example, the anisotropic conductive film may be prepared by dissolving a binder resin in an organic solvent, adding other components for the anisotropic conductive film, stirring the mixture for a certain period of time at a rate that does not cause pulverization of the conductive particles, applying the mixture to an suitable thickness, e.g., about 10 μm to about 50 μm, to a release film, and drying the mixture for a sufficient time to vaporize the organic solvent.

Another embodiment provides a semiconductor device bonded by an anisotropic conductive film, which has low temperature rapid curing characteristics.

When the anisotropic conductive film is bonded to an adherend through pre-compression at a temperature of about 50° C. to about 70° C. under a load of about 1.0 MPa to about 5.0 MPa for 1 to 5 seconds and primary compression at a temperature of about 110° C. to about 150° C. under a load of about 1.0 MPa to about 4.0 MPa for about 1 to about 7 seconds, the anisotropic conductive film may have linear indentations formed in a space between terminals of the adherend, and may have an adhesive strength of about 800 gf/cm or more. In an implementation, the anisotropic conductive film may have an adhesive strength of about 900 gf/cm or more, e.g., about 1,000 gf/cm or more.

As a result, it is possible to manufacture a semiconductor device, which may help ensure a good indentation state by the anisotropic conductive film securing a predetermined level or more of adhesive strength.

Adhesive strength of the anisotropic conductive film may be measured as follows. For example, a prepared anisotropic conductive film may be placed between a PCB (pitch: 300 μm, terminal width: 150 μm, distance between terminals: 150 μm, terminal height: 35 μm) and a COF (pitch: 300 μm, terminal width: 150 μm, distance between terminals: 150 μm, terminal height: 8 μm), and may be bonded therebetween under the following conditions.

1) Pre-compression: 60° C., 1 second, 1.0 MPa
2) Primary compression: 130° C., 3 seconds, 3 MPa Then, the adhesive strength may be measured at a peel angle of 90° and a peel speed of 50 mm/min using a peel strength tester H5KT (Tinius Olsen).

Figure 2:
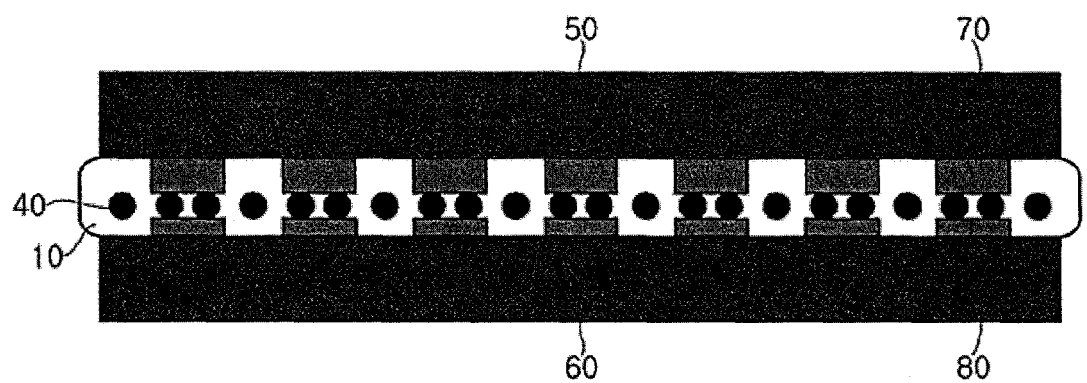
FIG. 2 illustrates a sectional view of a semiconductor device.

Referring to FIG. 2, a semiconductor device according to an embodiment will be described. As may be seen in FIG. 2, a semiconductor device may include a first connecting member 50 (having a first electrode 70) and a second connecting member 60 (having a second electrode 80). The first and second connecting members 50, 60 may be bonded to each other by an anisotropic conductive film 10 in accordance with an embodiment. When the anisotropic conductive film 10 is compressed between the first connecting member 50 (including the first electrode 70) and the second connecting member 60 (including the second electrode 80), the first electrode 70 may be electrically connected to the second electrode 80 via conductive particles 40.

For example semiconductor device according to this embodiment includes the first connecting member 50 including the first electrode 70; the second connecting member 60 including the second electrode 80; and the anisotropic conductive film 10 including conductive particles 40. When the anisotropic conductive film 10 (placed between the first connecting member 50 having the first electrode 70 and the second connecting member 60 having the second electrode 80) is compressed, the first electrode 70 and the second electrode 80 may be connected to each other via the conductive particles 40. In an implementation, the first and second connecting members 50, 60 may have similar structures in terms of material, thickness, size and interconnectivity. The first and second connecting members 50, 60 may have a thickness of about 20 μm to about 100 μm.

In an implementation, the first and second connecting members may have different structures and functions in terms of material, thickness, size and interconnectivity. The first connecting member or the second connecting member may be formed of glass, PCB (Printed Circuit Board), fPCB, COF, TCP, ITO glass, or the like. The first electrode or the second electrode may be a protruding electrode or a flat electrode. When the first and second electrodes are protruding electrodes, a gap (G) may be formed therebetween, and these electrodes may have a height (H) of about 2.50 μm to about 10 μm, a width (W) of about 50 μm to about 120 μm, and a gap (G) of about 50 μm to about 110 μm. For example, the electrodes may have a height (H) of about 2.50 μm to about 9 μm, a width (W) of about 50 μm to about 100 μm, and a gap (G) of about 60 μm to about 100 μm.

When the first and second electrodes are flat electrodes, these electrodes may have a thickness of about 500 Å to about 1,200 Å. The first or second electrode may be formed of, e.g., ITO, copper, silicon, IZO, or the like.

The flat electrodes may have a thickness of about 800 Å to about 1,200 Å, and the protruding electrodes have a height of about 6 μm to about 10 μm. In this case, when an insulating layer has a thickness of about 4 μm to about 12 μm, the film may exhibit sufficient adhesion. In an implementation, the flat electrodes may have a thickness of about 1,000 Å and the protruding electrodes may have a height of about 8 μm. In this case, the insulating layer may have a thickness of about 6 μm to about 10 μm.

The semiconductor device according to an embodiment may be manufactured according to a suitable method.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

Preparation of an Anisotropic Conductive Film Using an Acrylic Copolymer Resin Containing a Hydroxyl Group-Substituted Alkyl (Meth)Acrylate Monomer (1) Preparation of Anisotropic Conductive Film Composition An anisotropic conductive film composition was prepared by mixing 40 wt % of an acrylic copolymer resin having a weight average molecular weight of 80,000 g/mol and a glass transition temperature (Tg) of about 80° C. to 85° C.; 20 wt % of a polyurethane acrylate resin having a weight average molecular weight of 30,000 g/mol and a glass transition temperature (Tg) of about 20° C. to 25° C.; 10 wt % of an acrylonitrile-butadiene copolymer (1072CGX, Zeon Chemical) as a thermoplastic resin; 20 wt % of an acrylate monomer (4-HBA, Osaka) as a radical polymerizable material; 2 wt % of benzoyl peroxide (Hansol) as an organic peroxide; and 8 wt % of conductive particles (Ni) having an average particle diameter of 5 μm. The acrylic copolymer was a tertiary copolymer prepared through copolymerization of 35 wt % of cyclohexyl methacrylate (CHMA), 35 wt % of methyl methacrylate (MMA), and 30 wt % of hydroxy ethyl methacrylate (HEMA). The polyurethane acrylate resin was prepared by polymerization of 60 wt % of a polyol, 39 wt % of aliphatic isocyanate, and 1 wt % of hydroxy methacrylate in 50 vol % of methylethylketone provided as a solvent using dibutyltin dilaurylate as a catalyst at 90° C. and 1 atm. for 5 hours. First, the polyol was reacted with aliphatic isocyanate to prepare an aliphatic isocyanate-terminated pre-polymer. The prepared pre-polymer was additionally reacted with hydroxy methacrylate, thereby preparing the polyurethane acrylate resin. Here, a molar ratio of the aliphatic isocyanate to the hydroxy methacrylate was 1.0. The acrylonitrile-butadiene copolymer was prepared by dissolving an acrylonitrile-butadiene copolymer in 25 vol % of a solvent mixture of toluene and methylethylketone.

(2) Preparation of Anisotropic Conductive Film

The prepared composition was stirred at a rate that did not cause pulverization of the conductive particles at room temperature (25° C.) for 60 minutes. Then, the resulting material was applied to a polyethylene film subjected to silicone release treatment to form a 35 μm thick film. In formation of the film, a casting knife was used, and the film was dried at 60° C. for 5 minutes.

Example 2

Preparation of an Anisotropic Conductive Film Using an Acrylic Copolymer Resin Containing a Hydroxyl Group-Substituted Alkyl (Meth)Acrylate Monomer The anisotropic conductive film was prepared in the same manner as in Example 1, except that 30 wt % of the acrylic copolymer resin and 30 wt % of the polyurethane acrylate were used.

Example 3

Preparation of an Anisotropic Conductive Film Using an Acrylic Copolymer Resin Containing a Hydroxyl Group-Substituted Alkyl (Meth)Acrylate Monomer The anisotropic conductive film was prepared in the same manner as in Example 1, except that the tertiary acrylic copolymer prepared from the described monomers had a weight average molecular weight of 60,000 g/mol and a glass transition temperature Tg of about 70° C. to 75° C. was used.

The tertiary copolymer prepared through copolymerization of 35 wt % of cyclohexyl methacrylate (CHMA), 25 wt % of methyl methacrylate (MMA), and 40 wt % of hydroxy ethyl methacrylate (HEMA).

Comparative Example 1

Preparation of an Anisotropic Conductive Film Using an Acrylic Copolymer Resin not Containing a Hydroxyl Group-Substituted Alkyl (Meth)Acrylate Monomer The anisotropic conductive film was prepared in the same manner as in Example 1, except that, instead of the tertiary acrylic copolymer resin, 40 wt % of a binary acrylic copolymer having a weight average molecular weight of 100,000 g/mol and a glass transition temperature Tg of about 80° C. to 85° C. was used. Here, the binary acrylic copolymer was prepared through copolymerization of 50 wt % of cyclohexyl methacrylate (CHMA) and 50 wt % of methyl methacrylate (MMA).

Comparative Example 2

Preparation of an Anisotropic Conductive Film Using a Polyurethane Resin Instead of an Acrylic Copolymer Resin The anisotropic conductive film was prepared in the same manner as in Example 1, except that, instead of the acrylic copolymer resin, 60 wt % of the polyurethane acrylate was used.

The compositions of the anisotropic conductive films prepared in Examples 1 to 3 and Comparative Examples 1 and 2 are shown in Table 1, below.

TABLE 1

| Composition (wt %) | Example 1 | Example 2 | Example 3 | Comparative Example 1 | Comparative Example 2 |
|---|---|---|---|---|---|
| Acrylic copolymer resin containing hydroxyl group | 40 | 30 | 40 | — | — |
| Acrylic copolymer Tg (° C.) | 80~85 | 80~85 | 70~75 | 80~85 | 80-85 |
| Acrylic copolymer resin not containing hydroxyl group | — | — | — | 40 | — |
| Polyurethane resin | 20 | 30 | 20 | 20 | 60 |
| Thermoplastic resin | 10 | 10 | 10 | 10 | 10 |
| Radical polymerizable material | 20 | 20 | 20 | 20 | 20 |
| Organic peroxide | 2 | 2 | 2 | 2 | 2 |
| Conductive particles | 8 | 8 | 8 | 8 | 8 |
| Total | 100 | 100 | 100 | 100 | 100 |

Experimental Example 1

Measurement of Indentation State

To evaluate an indentation state of each of the anisotropic conductive films prepared in Examples 1 to 3 and Comparative Examples 1 and 2, the following experiment was performed.

Each of the prepared five anisotropic conductive films was placed between a PCB (pitch: 300 μm, terminal width: 150 μm, distance between terminals: 150 μm, terminal height: 35 μm) and a COF (pitch: 300 μm, terminal width: 150 μm, distance between terminals: 150 μm, terminal height: 8 μm), and was bonded therebetween under the following conditions. Then, indentations formed in an inter-terminal space were observed through an optical microscope (Olympus GX-41).

1) Pre-compression: 60° C., 1 second, 1.0 MPa
2) Primary compression: 130° C., 3 seconds, 3 MPa When the area of the indentations formed on the compressed anisotropic conductive film occupied 30% or less of the overall area of the inter-terminal space while sharing the centerline of the inter-terminal space, these indentations were evaluated as 'linear indentations', and when the area of the indentations occupied larger than 30% of the overall area of the inter-terminal space while sharing the centerline of the inter-terminal space, these indentations were evaluated as 'rounded indentations'.

Experimental Example 2

Measurement of Adhesive Strength

To measure adhesive strength of each of the anisotropic conductive films prepared in Examples 1 to 3 and Comparative Examples 1 and 2, the following experiment was performed.

Each of the five prepared anisotropic conductive films was placed between a PCB (pitch: 300 μm, terminal width: 150 μm, distance between terminals: 150 μm, terminal height: 35 μm) and a COF (pitch: 300 μm, terminal width: 150 μm, distance between terminals: 150 μm, terminal height: 8 μm), and was bonded therebetween under the following conditions.

1) Pre-compression: 60° C., 1 second, 1.0 MPa
2) Primary compression: 130° C., 3 seconds, 3 MPa Then, the adhesive strength may be measured at a peel angle of 90° and a peel speed of 50 mm/min using a peel strength tester H5KT (Tinius Olsen).

Test results of Experimental Examples 1 and 2 are shown in Table 2, below.

TABLE 2

| Properties | Example 1 | Example 2 | Example 3 | Comparative Example 1 | Comparative Example 2 |
|---|---|---|---|---|---|
| Indentation state | Linear indentations | Linear indentations | Linear indentations | Linear indentations | Rounded indentations |
| Adhesive strength (gf/cm) | 1130 | 1250 | 1280 | 700 | 1250 |

As may be seen in Table 2, when the acrylic copolymer containing the hydroxyl group-substituted alkyl (meth)acrylate monomer was used as the binder resin (Example 1 to 3), the anisotropic conductive films exhibited linear indentations and had an excellent adhesive strength of 800 gf/cm or more. In Comparative Example 1, in which the acrylic copolymer did not contain a hydroxyl group, the anisotropic conductive film had an adhesive strength of less than 800 gf/cm. In Comparative Example 2, in which the urethane resin was used alone, the anisotropic conductive film exhibited rounded indentations.

Acrylic copolymer resins may have low adhesion. However, it may be seen that, when an acrylic resin prepared through copolymerization using a hydroxyl group-substituted alkyl (meth)acrylate monomer as one component was used in preparation of an anisotropic conductive film as in Examples 1 to 3, the anisotropic conductive film provided an excellent indentation state while also securing a predetermined level or more of adhesion.

By way of summation and review, when an anisotropic conductive film is used to bond a semiconductor device, observation of an indentation state may be performed in order to evaluate bonding of the film to a substrate.

Some anisotropic conductive films may have improved adhesion or may be capable of being rapidly cured at low temperature. Accordingly, a high elasticity binder resin such as urethane resins may be used to improve adhesion of the anisotropic conductive film. The use of such a high elasticity binder resin may cause uneven indentations or severe roundness.

The embodiments may provide a semiconductor device bonded by an anisotropic conductive film such that linear indentations are formed upon primary compression of the anisotropic conductive film.

The embodiments may provide a semiconductor device bonded by an anisotropic conductive film that allows pressure to be evenly applied to the film upon primary compression of the anisotropic conductive film, thereby exhibiting linear indentations.

The embodiments may provide a semiconductor device bonded by an anisotropic conductive film that provides excellent adhesion while exhibiting linear indentations.

The embodiments may provide a semiconductor device bonded by an anisotropic conductive film, which includes an acrylic copolymer containing a hydroxyl group-substituted alkyl (meth)acrylate monomer as a binder resin, thereby providing excellent adhesion while exhibiting linear indentations.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first connecting member including a first electrode;
   a second connecting member including a second electrode; and
   an anisotropic conductive film between the first connecting member and the second connecting member, the anisotropic conductive film bonding the first electrode to the second electrode,
   wherein the anisotropic conductive film exhibits linear indentations in an inter-terminal space of the second connecting member after pre-compression and primary compression of the anisotropic conductive film onto the first and second connecting members,
   wherein the linear indentations are in an area occupying about 30% or less of an overall area of the inter-terminal space while sharing a centerline of the inter-terminal space, and
   wherein the anisotropic conductive film includes:
      about 10 wt % to about 70 wt % of an acrylic copolymer resin;
      about 1 wt % to about 50 wt % of a polyurethane resin;
      about 1 wt % to about 40 wt % of a radical polymerizable material; and
      about 1 wt % to about 30 wt % of conductive particles, all wt % being based on a total weight of the anisotropic conductive film in terms of solid content.

2. The semiconductor device as claimed in claim 1, wherein the first connecting member has a film shape and the second connecting member has a substrate shape.

3. The semiconductor device as claimed in claim 1, wherein:
   the pre-compression is performed at a temperature of about 50° C. to about 70° C. under a load of about 1.0 MPa to about 5.0 MPa for about 1 to about 5 seconds, and
   the primary compression is performed at a temperature of about 110° C. to about 150° C. under a load of about 1.0 MPa to about 4.0 MPa for about 1 to about 7 seconds.

4. The semiconductor device as claimed in claim 3, wherein the anisotropic conductive film has an adhesive strength of about 800 gf/cm or more as measured after the pre-compression and the primary compression.

5. The semiconductor device as claimed in claim 1, wherein the acrylic copolymer resin includes repeating units derived from a hydroxyl group-substituted alkyl (meth)acrylate monomer.

6. The semiconductor device as claimed in claim 5, wherein the hydroxyl group-substituted alkyl (meth)acrylate monomer is hydroxyethyl (meth)acrylate.

7. The semiconductor device as claimed in claim 5, wherein the repeating units derived from the hydroxyl group-substituted alkyl (meth)acrylate monomer are present in an amount of about 10 wt % to about 50 wt %, based on a total weight of the acrylic copolymer resin.

8. The semiconductor device as claimed in claim 1, wherein the acrylic copolymer resin is prepared by copolymerization of a hydroxyl group-substituted alkyl (meth)acrylate monomer and at least one of an aliphatic alkyl(meth)acrylate monomer or an alicyclic alkyl(meth)acrylate monomer.

9. The semiconductor device as claimed in claim 1, wherein the acrylic copolymer resin includes repeating units derived from cyclohexyl (meth)acrylate, methyl (meth)acrylate, and hydroxyethyl (meth)acrylate monomers.

10. The semiconductor device as claimed in claim 1, wherein the acrylic copolymer resin has a glass transition temperature of about 70° C. or higher.

11. The semiconductor device as claimed in claim 1, wherein the anisotropic conductive film has an adhesive strength of about 1,000 gf/cm or greater.

12. The semiconductor device as claimed in claim 1, wherein the anisotropic conductive film has an adhesive strength of 1130 gf/cm to 1280 gf/cm.

* * * * *